(12) United States Patent
Takashima et al.

(10) Patent No.: US 7,312,186 B2
(45) Date of Patent: Dec. 25, 2007

(54) CLEANING SOLUTION FOR SEMICONDUCTOR SUBSTRATE

(75) Inventors: Masayuki Takashima, Sodegaura (JP); Yoshiko Kasama, Kawasaki (JP); Hiroaki Tomimori, Kawasaki (JP); Hidemitsu Aoki, Kawasaki (JP)

(73) Assignees: Kanto Chemical Co., Inc., Tokyo (JP); NEC Electronics Corporation, Kanagawa (JP)

( * ) Notice: Subject to any disclaimer, the term of this patent is extended or adjusted under 35 U.S.C. 154(b) by 204 days.

(21) Appl. No.: 10/750,971

(22) Filed: Jan. 5, 2004

(65) Prior Publication Data

US 2004/0161933 A1 Aug. 19, 2004

(30) Foreign Application Priority Data

Jan. 10, 2003 (JP) .............................. 2003-004194

(51) Int. Cl.
*C11D 1/72* (2006.01)
*C11D 1/722* (2006.01)
*C11D 7/08* (2006.01)
*C11D 9/22* (2006.01)

(52) U.S. Cl. ...................... 510/175; 510/176; 510/258; 510/272; 510/273; 510/413; 510/421; 510/434; 510/435; 510/475

(58) Field of Classification Search ................ 510/175, 510/176, 258, 272, 273, 413, 421, 434, 435, 510/475
See application file for complete search history.

(56) References Cited

U.S. PATENT DOCUMENTS

2003/0144163 A1* 7/2003 Morinaga et al. ........... 510/175
2004/0142835 A1* 7/2004 Takashima .................. 510/175

FOREIGN PATENT DOCUMENTS

| JP | 2001-217215 A | 8/2001 |
| JP | 2002-270566 A | 9/2002 |
| JP | 2003-289060 A | 10/2003 |

* cited by examiner

*Primary Examiner*—Brian Mruk
(74) *Attorney, Agent, or Firm*—Sughrue Mion, PLLC

(57) ABSTRACT

A cleaning solution for semiconductor substrates comprising a nonionic surface active agent of the formula (1) and/or the formula (2), a chelating agent and a chelating accelerator:

$$CH_3-(CH_2)_l-O-(C_mH_{2m}O)_n-X \quad (1)$$

wherein l, m and n independently represent a positive number, and X represents a hydrogen atom or a hydrocarbon group;

$$CH_3-(CH_2)_a-O-(C_bH_{2b}O)_d-(C_xH_{2x}O)_y-X \quad (2)$$

wherein a, b, d, x and y independently represent a positive number, b and x are different, and X represents a hydrogen atom or a hydrocarbon group.

9 Claims, 2 Drawing Sheets

(a)

(b)

(c)

(c-2)

(d)

(e)

(f)

CLEANING SOLUTION FOR SEMICONDUCTOR SUBSTRATE

BACKGROUND OF THE INVENTION

1. Field of the Invention

The present invention relates to a cleaning solution for semiconductor substrates.

2. Description of Related Art

Recently, Cu wiring is introduced into semiconductor devices, and for the formation of Cu wiring, a chemical and mechanical polishing process (CMP process) is employed.

This CMP process comprises forming grooves or connecting holes in a previously flattened insulating film of low dielectric constant, such as of carbon-containing $SiO_2$ (SiOC), then forming a Cu film, for example by plating method to fill the grooves or connecting holes, and polishing the surface with a slurry containing special abrasive grains and additives to remove Cu in the portions other than the grooves or connecting holes, thereby flattening the surface and forming the wiring or connecting holes.

On the semiconductor substrate after subjected to the CMP process, there are fine foreign particulate substances such as abrasive grains contained in the polishing slurry or polishing detritus and ionic foreign substances such as metal impurities in large amounts. Therefore, it has been demanded to develop cleaning solutions which can remove simultaneously the particulate foreign substances and ionic foreign substances.

As these cleaning solutions, there have been known, for example, those which contain a nonionic surface active agent having a phenylene group such as polyoxyethylenenonylphenyl ether, a compound forming a complex with a metal such as aminoacetic acid or quinaldic acid, and an alkali component (JP-A-2002-270566).

BRIEF SUMMARY OF THE INVENTION

However, the above cleaning solutions are inferior in wettability with hydrophobic insulating films of low dielectric constant, such as of SiOC, and it is difficult to remove the particulate foreign substances and ionic foreign substances on the semiconductor substrates after subjected to CMP process.

The object of the present invention is to provide a cleaning solution excellent in removability of particulate foreign substances and ionic foreign substances present on a semiconductor substrate after subjected to CMP process.

As a result of intensive research conducted by the inventors in an attempt to find a cleaning solution which can solve the above problems, it has been found that a cleaning solution containing at least one nonionic surface active agent having no phenylene group which is represented by the following formulas (1) and (2), a chelating agent and a chelating accelerator is excellent in removal of particulate foreign substances and ionic foreign substances present on a semiconductor substrate. Thus, the present invention has been accomplished.

That is, the present invention provides a cleaning solution for semiconductor substrates which contains a nonionic surface active agent represented by the following formula (1) and/or formula (2), a chelating agent and a chelating accelerator:

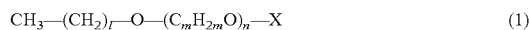 (1)

(in the above formula, l, m and n independently represent a positive number, and X represents a hydrogen atom or a hydrocarbon group)

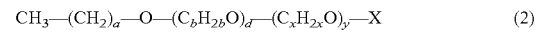 (2)

(in the above formula, a, b, d, x and y independently represent a positive number, b and x are different, and X represents a hydrogen atom or a hydrocarbon group).

DETAILED DESCRIPTION OF THE INVENTION

Figure 1:
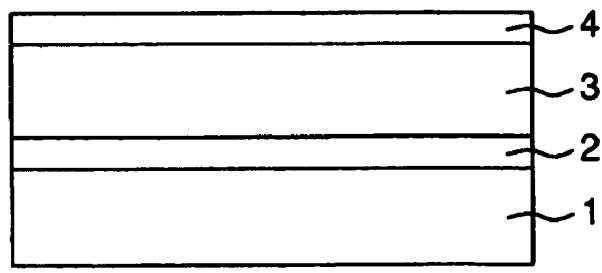
FIG. 1 is a sectional flow sheet which shows one example of steps for producing a semiconductor device using the cleaning solution of the present invention
Figure 1:
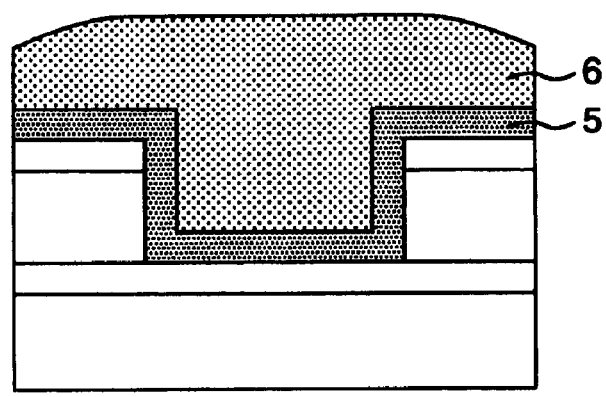
Figure 1:
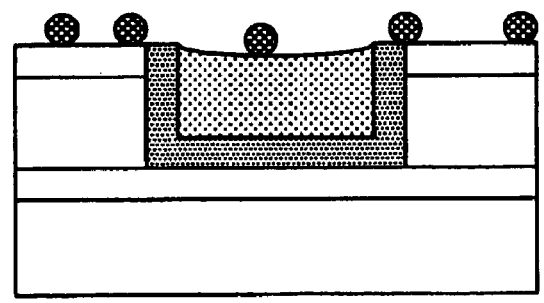
Figure 1:
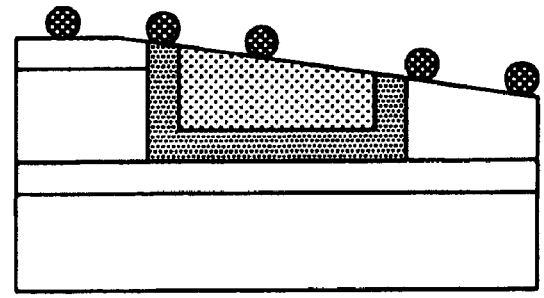
Figure 1:
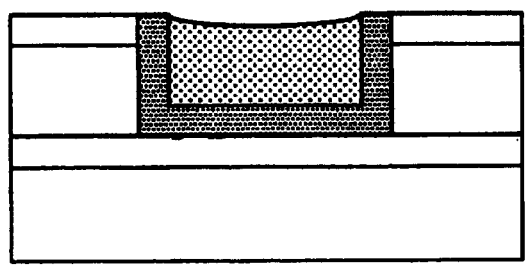
Figure 1:
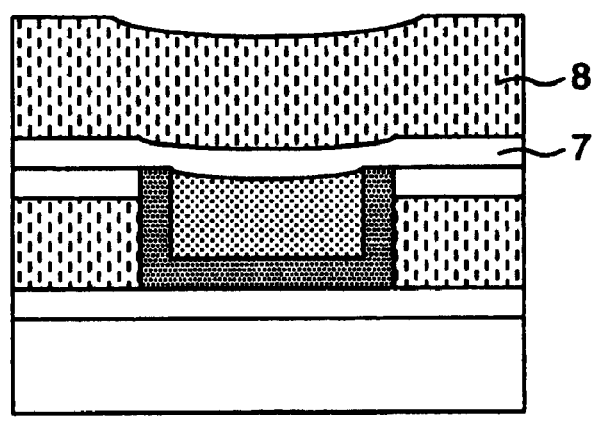
Figure 1:
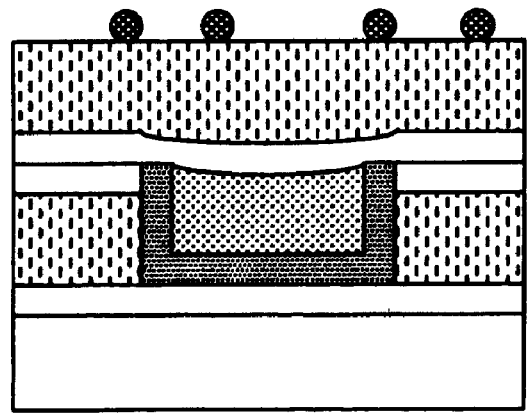

The nonionic surface active agent contained in the cleaning solution of the present invention is represented by the following formula (1) or (2):

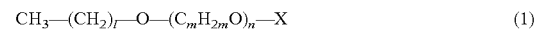 (1)

(in the above formula, l, m and n independently represent a positive number, and X represents a hydrogen atom or a hydrocarbon group)

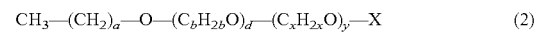 (2)

(in the above formula, a, b, d, x and y independently represent a positive number, b and x are different, and X represents a hydrogen atom or a hydrocarbon group).

In the formulas (1) and (2), l and a represent a positive number and are preferably 8-18, more preferably 8-11, and further preferably 9-11.

If l and a are less than 8 or more than 18, the cleaning solution becomes inferior in wettability with an insulating film of low dielectric constant, and satisfactory removability of particulate foreign substances tends to decrease. Especially, if l and a exceed 18, action as an oleophilic group increases and hence the nonionic surface active agent hardly dissolves in an aqueous solution. X represents a hydrogen atom or a hydrocarbon group. The hydrocarbon groups include, for example, methyl and ethyl.

In the formula (1), m represents a positive number and is preferably 2 or 3, more preferably 2, and n represents a positive number and is preferably 4-20, more preferably 5-10.

If n is less than 4, the solubility to an aqueous solution becomes inferior, and if n exceeds 20, the cleaning solution tends to inferior in wettability with an insulating film of low dielectric constant.

In the formula (2), b and d represent a positive number, b is usually 2 and d is usually 1-20, preferably 1-10. If d exceeds 20, the cleaning solution becomes inferior in wettability with an insulating film of low dielectric constant.

In the formula (2), x and y represent a positive number, x is usually 3-10, preferably 3-5, more preferably 3. If x exceeds 10, the solubility to an aqeous solution becomes inferior.

Further, y is usually 1-10, preferably 1-5. If y exceeds 10, the cleaning solution becomes inferior in wettability with an insulating film of low dielectric constant.

The nonionic surface active agent represented by the formula (2) has a polymerized form of two kinds of alkylene oxides. The polymerized form is not particularly limited, and may be the forms obtained by random copolymerization, block copolymerization and so on. If the form is obtained by random copolymerization, in the formula (2), d and y are independently represent a total number of the repeating units of $(C_bH_{2b}O)$ and $(C_xH_{2x}O)$ in the molecular chains. The end group of X may bond the repeating unit of either $(C_bH_{2b}O)$ or $(C_xH_{2x}O)$.

In the nonionic surface active agent represented the formula (1) and (2), the starting material of the oleophilic group portion represented by $CH_3$—$(CH_2)_l$ and $CH_3$—$(CH_2)_a$— is a primary alcohol, in which preferably l and a are 9-11. Even if the total carbon numbers of the oleophilic group is 10-12, the nonionic surface active agent produced from a secondary alcohol, for example, which are represented by the following formulas (4) and (5), remains on the surface of the substrate. Further, removability of particulate foreign substances is insufficient and it does not provide a satisfactory cleaning property:

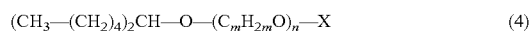

$$(CH_3—(CH_2)_4)_2CH—O—(C_mH_{2m}O)_n—X \quad (4)$$

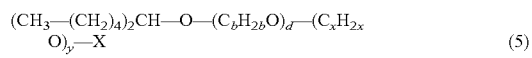

$$(CH_3—(CH_2)_4)_2CH—O—(C_bH_{2b}O)_d—(C_xH_{2x}O)_y—X \quad (5)$$

(in the above formulas, m, n, b, d, x, y and X have the same meanings identified above)

Examples of the nonionic surface active agent represented the formulas (1) or (2) are polyoxyethylene decyl ether, polyoxyethylene lauryl ether, polyoxyethylene cetyl ether, polyoxyethylene stearyl ether, polyoxyethylene polyoxypropylene decyl ether, polyoxyethylene polyoxypropylene lauryl ether, polyoxyethylene polyoxypropylene stearyl ether, etc.

Among them, polyoxyethylene decyl ether, polyoxyethylene lauryl ether, polyoxyethylene polyoxypropylene decyl ether and polyoxyethylene polyoxypropylene lauryl ether are preferred.

The concentration of the nonionic surface active agent, namely the total contents of the agents represented by the formulas (1) and (2), in the cleaning solution is preferably 0.0001-1% by weight, more preferably 0.001-1% by weight.

If the concentration is less than 0.0001% by weight, wettability with an insulating film of low dielectric constant tends to deteriorate, and if it exceeds 1% by weight, the cleaning solution froths vigorously to hinder the operation of cleaning.

The chelating agent is not particularly limited so long as it can remove metals. As examples thereof, mention may be made of at least one compound selected from the group consisting of polyaminocarboxylic acids, polycarboxylic acids, compounds having phosphonic acid group, oxycarboxylic acids, phenols, heterocyclic compounds and tropolones. They include salts or derivatives thereof.

The polyaminocarboxylic acids include, for example, ethylenediaminetetraacetic acid (EDTA), trans-1,2-cyclohexanediaminetetraacetic acid (CyDTA), nitrilotriacetic acid (NTA), diethylenetriamine-pentaacetic acid (DTPA), and N-(2-hydroxyethyl)-ethylenediamine-N,N',N'-triacetic acid (EDTA-OH).

Among them, ethylenediaminetetraacetic acid (EDTA) is preferred.

The polycarboxylic acids include, for example, oxalic acid, malonic acid, succinic acid, glutaric acid, methylmalonic acid, 2-carboxybutyric acid, and ammonium salts of these acids.

Among them, oxalic acid and ammonium oxalate are suitable.

The compounds having phosphonic acid group include, for example, ethylenediaminetetramethylenephosphonic acid, ethylenediaminedimethylenephosphonic acid, nitrilotrismethylenephosphonic acid, and 1-hydroxyethylidenediphosphonic acid.

Among them, 1-hydroxyethylidenediphosphonic acid is suitable.

The oxycarboxylic acids include, for example, gluconic acid, tartaric acid and citric acid.

Among them, citric acid and ammonium citrate are suitable.

The phenols include, for example, phenol, cresol, ethylphenol, t-butylphenol, methoxyphenol, catechol, resorcinol, hydroquinone, 4-methylpyrocatechol, 2-methylhydroquinone, pyrogallol, 3,4-dihydroxybenzoic acid, gallic acid, 2,3,4-trihydroxybenzoic acid, 2,4-dihydroxy-6-methylbenzoic acid, ethylenediaminediorthohydroxyphenylacetic acid [EDDHA], N,N-bis(2-hydroxybenzyl)ethylenediamine-N,N-diacetic acid [HBED], and ethylenediaminedihydroxymethylphenylacetic acid [EDDHMA].

Among them, catechol and ethylenediaminediorthohydroxyphenylacetic acid [EDDHA] are suitable.

The heterocyclic compounds include, for example, 8-quinolinol, 2-methyl-8-quinolinol, quinolinediol, 1-(2-pyridyl-azo)-2-naphthol, 2-amino-4,6,7-pteridinetriol, 5,7,3',4'-tetrahydroxyflavone [luteolin], 3,3'-bis[N,N-bis(carboxymethyl)amino-methyl]fluorescein [calcein], and 2,3-hydroxypyridine.

Among them, 8-quinolinol is suitable.

The tropolones include, for example, tropolone and 6-isopropyltropolone.

Among them, tropolone is suitable.

The concentration of the chelating agent in the cleaning solution is preferably 0.00001-10% by weight, more preferably 0.0001-1% by weight.

If the concentration is less than 0.00001% by weight, performance for removing metals as chelating agent tends to decrease, and if it exceeds 10% by weight, solubility in the cleaning solution tends to lower.

The chelating accelerator is added for more effectively chelating the metal impurities deposited on the semiconductor substrates.

As the chelating accelerators, mention may be made of general acidic compounds, alkaline compounds, salts thereof, etc. The acidic compounds include, for example, fluorides or salts thereof. The alkaline compounds include, for example, hydroxides and salts thereof.

The fluorides or salts thereof include, for example, hydrofluoric acid, potassium fluoride, sodium fluoride and ammonium fluoride.

Among them, ammonium fluoride is suitable.

Here, as the hydroxides, compounds having a hydroxyl group are mentioned. The hydroxides include, for example, inorganic compounds such as sodium hydroxide, potassium hydroxide and ammonium hydroxide; hydroxides of quaternary ammonium, such as tetramethylammonium hydroxide and choline; and alkanolamines such as monoethanolamine, diethanolamine, triethanolamine, 2-methylaminoethanol, 2-ethylaminoethanol, N-methyldiethanolamine, dimethylaminoethanol, 2-(2-aminoethoxy)ethanol, 1-amino-2-propanol, monopropanolamine, and dibutanolamine.

Among them, compounds containing no metal, such as ammonium hydroxide, tetramethylammonium hydroxide and choline can be suitably used from the viewpoint that they do not contaminate the surface of semiconductor substrate (silicon wafer) with metals.

The chelating accelerator preferably contains both of a hydroxide and a fluoride or salt thereof. Those which contain only a hydroxide or only a fluoride or a salt thereof tend to exhibit insufficient effect, and those which contain both of them are preferred because they can improve metal removability of the chelating agent.

The concentration of the fluoride or salt thereof in the cleaning solution is preferably 0.0001-40% by weight, more preferably 0.01-5% by weight.

If the concentration is less than 0.0001% by weight, the metal removability tends to lower, and if it exceeds 40% by weight, quality of the insulating film of low dielectric constant tends to deteriorate while metal removability is not improved.

The concentration of the hydroxide in the cleaning solution is preferably 0.0001-30% by weight, more preferably 0.001-1% by weight. If the concentration is less than 0.0001% by weight, the metal removability tends to lower, and if it exceeds 30% by weight, film quality of the insulating film of low dielectric constant tends to deteriorate.

As to the relation in concentration of the hydroxide and the fluoride or salt thereof, the concentration of the hydroxide is preferably lower than that of the fluoride or salt thereof.

If the concentration of the hydroxide is higher than that of the fluoride or salt thereof, quality of the under insulating film of low dielectric constant tends to deteriorate.

The cleaning solution of the present invention aims at removing particulate foreign substances and ionic foreign substances on a semiconductor substrate (wafer) having exposed insulating film of low dielectric constant during preparation of semiconductor devices, but since Cu wiring is also sometimes exposed, the cleaning solution of the present invention preferably further contains a corrosion inhibitor for metals.

The corrosion inhibitors for metals preferably have at least one of nitrogen atom, oxygen atom, phosphor atom and sulfur atom in the molecule, and more preferred are compounds having at least one azole group in the molecule, such as benzotriazole, tolutriazole, 4-methylimidazole, 5-hydroxymethyl-4-methylimidazole and 3-aminotriazole.

It is further preferred that the corrosion inhibitors for metals contain an aliphatic alcohol compound of 2 or more carbon atoms which has at least one mercapto group, the carbon atom to which the mercapto group is bonded and the carbon atom to which hydroxyl group is bonded being adjacent to each other.

Examples of the corrosion inhibitors for metals are thioglycerol and thioglycol.

The pH of the cleaning solution of the present invention is preferably 7-12, more preferably 7 or higher and lower than 9. If the pH is lower than 7 (acidic), not only the removability for fine particles tends to deteriorate, but also corrosion due to battery effect between Cu and barrier metal is apt to occur during cleaning operation.

The cleaning solution of the present invention is excellent in removal of particulate foreign substances and ionic foreign substances on a semiconductor substrate (wafer), on the surface of which an insulating film of low dielectric constant is exposed.

As the insulating films of low dielectric constant, mention may be made of inorganic films such as of FSG (F-containing $SiO_2$), SiOC (carbon-containing $SiO_2$) and SiON (N-containing $SiO_2$), polyorganosiloxane films such as of MSQ (methylsesquioxane), HSQ (hydrogensilsesquioxane) and MHSQ (methylated hydrogensilsesquioxane, aromatic films such as of PAE (polyaryl ether) and BCB (divinylsiloxane-bis-benzocyclobutene), and organic films such as of Silk and porous SilK, etc.

The insulating film of low dielectric constant in the present specification usually means an insulating film having a relative dielectric constant of not higher than 3.0.

The cleaning solutions of the present invention can be used irrespective of kind of the insulating films of low dielectric constant and method of the film formation, but since they are effective especially for the insulating films such as of SiOC, MSQ and PAE (polyaryl ether), preferably they are used for these insulating films.

The cleaning solution of the present invention may be used singly, but may be used in admixture with other chemicals as far as the attainment of the present invention is not hindered.

As examples of other chemicals, mention may be made of various anionic, cationic and nonionic surface active agents, dispersing agents, corrosion inhibitors for metals, aqueous hydrogen peroxide, etc.

Moreover, anti-foaming agents may be added for inhibiting the foaming caused by the surface active agents.

The anti-foaming agents include, for example, anti-foaming agents of silicone type, polyether type, special nonionic type, fatty acid ester type, etc. and water-soluble organic compounds such as methanol, ethanol, 1-propanol, 2-propanol, 2-methyl-1-propanol, acetone, and methyl ethyl ketone.

The methods for cleaning semiconductor substrates (silicon wafer, etc.) using the cleaning solution of the present invention include, for example, a dip cleaning method which comprises directly dipping the wafer in the cleaning solution, a dip cleaning method which is combined with application of ultrasonic waves, a spray cleaning method which comprises spraying the cleaning solution onto the surface of the substrate, a brush scrubbing method which comprises cleaning by a brush while spraying the cleaning solution, a brush scrubbing method which is further combined with application of ultrasonic waves, etc.

The cleaning solution may be heated for cleaning.

As an example of cleaning with the cleaning solution of the present invention, explanation will be made of a case where a wafer on which an insulating film of low dielectric constant is exposed is cleaned in production of semiconductor devices.

First, as shown in FIG. 1(a), a silicon oxide film 1 and a silicon nitride film 2 are formed on a semiconductor substrate (not shown) on which elements such as transistor are formed, and thereafter an insulating film 3 of low dielectric constant and a cap layer film 4 (e.g., $SiO_2$ film) for protecting the insulating film of low dielectric constant are formed. Then, a groove is formed by a known lithography process, and thereafter a barrier metal film 5 and a copper film 6 are formed as shown in FIG. 1(b), and a copper wiring is formed by polishing the copper film and the barrier metal film using a known CMP process. Thereafter, the polishing detritus deposited on the surface by polishing, slurry components and metallic impurities in the polishing agent, etc. as shown in FIG. 1(c) are removed. In case the CMP process can perform uniform polishing of the surface of the wafer, the insulating film of low dielectric constant is not exposed on the surface, but in case the polishing cannot be uniformly carried out, a part of the cap layer is sometimes removed by the polishing to expose the insulating film of low dielectric constant as shown in FIG. 1(c-2). In this case, the exposed insulating film of low dielectric constant can hardly be cleaned by the conventional cleaning solutions, but the cleaning solution of the present invention can be applied to cleaning of the exposed insulating film.

Moreover, in the case of wide wiring, desiccation is apt to occur, and when a cap layer film 7 is formed on the copper wiring and further an upper insulating film 8 of low dielectric constant is formed after completion of cleaning, a dent portion is also formed on the upper insulating film 8 of low dielectric constant reflecting the dent portion at the center of the Cu wiring, thereby to make the film 8 uneven. If the insulating film 8 of low dielectric constant has a dent portion, there may occur the possibility of being out of focus in the lithography of the subsequent step, and hence the insulating film of low dielectric constant must be flattened by CMP process. The cleaning solution of the present invention can also be applied to removal of the foreign substances on the surface of such an insulating film after subjected to polishing by CMP process.

The cleaning solution of the present invention is excellent in removal of particulate foreign substances and ionic foreign substances on semiconductor substrates after subjected to CMP process and can be suitably used for cleaning of the surface of the substrates on which an insulating film of low dielectric constant having hydrophobic surface is exposed.

EXAMPLES

The present invention will be explained in more detail based on the following examples, which should not be construed as limiting the invention in any manner.

Example 1

Cleaning solutions 1 and 2 were prepared following the formulations shown in Table 1. A wafer having an SiOC film which was a kind of an insulating film of low dielectric constant, and the surface of which was previously contaminated with fine particles and metal impurities was cleaned using the cleaning solutions and a brush cleaning apparatus. The concentrations of the remaining fine particles and metal impurities are also shown in Table 1.

The contamination of the surface of the SiOC film wafer with fine particles before cleaning was conducted by dipping the wafer in a slurry for CuCMP to contaminate the surface of the film with abrasive grains in the slurry. The number of contaminating particles before cleaning was 3000/wafer. The contamination with metal impurities was conducted by actually polishing the Cu film by CuCMP to contaminate the exposed SiOC film with metals. The degree of contamination with metals before cleaning was $5 \times 10^{12}$ atoms/cm$^2$ in the case of Cu.

TABLE 1

|  | Cleaning solution 1 | Cleaning solution 2 |
|---|---|---|
| Polyoxyethylene lauryl ether*1 | 0.1% |  |
| Polyoxyetylene polyoxypropylene lauryl ether*2 |  | 0.1% |
| Ammonium oxalate | 0.1% | 0.1% |
| Hydroxyethanediphosphonic acid | 0.01% | 0.01% |
| NH$_4$OH | 0.05% | 0.05% |
| NH$_4$F | 0.4% | 0.4% |
| pH | 8.5 | 8.5 |
| The number of fine particles After cleaning (number/wafer) | 40 | 98 |
| Amount of deposited Cu after Cleaning ($\times 10^{10}$ atoms/cm$^2$) | <1 | <1 |

*1: A nonionic surface active agent represented by the formula (1) wherein l is 11, m is 2, n is 8, and X is a hydrogen atom.
*2: A nonionic surface active agent represented by the formula (2) wherein a is 11, b is 2, d is 10, x is 3, y is 1, and X is a hydrogen atom.

As shown in Table 1, fine particles and Cu impurities on the SiOC film were removed to such a level as necessary for production of semiconductor devices by washing the cleaning solutions of the present invention.

Example 2 and Comparative Examples 1 and 2

The SiOC film contaminated with fine particles by the same method in Example 1 was cleaned using the brush cleaning apparatus. The cleaning solutions were shown in Table 2 in which the surface active agents in the cleaning solutions were changed. The cleaning solutions were compared on fine particle removability, and the results are shown in Table 2. Furthermore, wettability of each cleaning solution with SiOC film was compared by measuring the contact angle of the cleaning solution and the SiOC film.

TABLE 2

|  | Example 2 Cleaning solution 1 | Comparative Example 1 Cleaning solution 3 | Comparative Example 2 Cleaning solution 4 |
|---|---|---|---|
| Polyoxyethylene lauryl ether*1 | 0.1% |  |  |
| SOFUTANOL 70*3 |  | 0.1% |  |
| Ammonium oxalate | 0.1% | 0.1% | 0.1% |
| Hydroxyethane-diphosphonic acid | 0.01% | 0.01% | 0.01% |
| NH$_4$OH | 0.05% | 0.05% | 0.05% |
| NH$_4$F | 0.4% | 0.4% | 0.4% |
| The number of Fine particles after cleaning (number/wafer) | 40 | 500 | 3000 |
| Contact angle with SiOC film (°) | 28 | 30 | 89 |

*1: A nonionic surface active agent represented by the formula (1) in which l is 11, m is 2, n is 8, and X is a hydrogen atom.
*3: A secondary higher alcohol ethoxylate manufactured by NIPPON SHOKUBAI CO., LTD. A surface active agent represented by the formula (4) in which m is 2, n is 7, and X is a hydrogen atom and prepared using a secondary alcohol having an oleophilic group of 12 carbon atoms.

As shown in Table 2, wettability with the SiOC film was inferior and fine particles were hardly removed in Comparative Example 2 where no surface active agent was contained. On the other hand, by adding the surface active agent, the wettability could be improved, but the surface active agent of Comparative Example 1 was inferior in fine particle removability and was at such a level as insufficient for producing semiconductor devices.

Example 3 and Comparative Examples 3 and 4

Cleaning solutions were prepared following the formulations shown in Table 3. A silicon oxide film wafer was immersed for 2 minutes in the cleaning solutions. Thereafter the amount of metals remaining on the surface of the wafer was analyzed. Before cleaning, the silicon oxide film wafer was revolved on a spin coater revolving at 200 rpm, and 40 ml of ultrahigh purity water containing 1 ppm of Fe and Al was dripped on the surface to contaminate the surface of the silicon oxide film with metals. As to the amounts of metals deposited on the surface before cleaning, the amount of Fe was $490 \times 10^{10}$ atoms/cm$^2$ and that of Al was $340 \times 10^{10}$ atoms/cm$^2$.

TABLE 3

|  | Example 3 Cleaning solution 1 | Comparative Example 3 Cleaning solution 5 | Comparative Example 4 Cleaning solution 6 |
|---|---|---|---|
| Polyoxyethylene lauryl ether*1 | 0.1% | 0.1% | 0.1% |
| Ammonium oxalate | 0.1% | 0.1% |  |
| Hydroxyethane-diphosphonic acid | 0.01% | 0.01% |  |
| $NH_4OH$ | 0.05% |  |  |
| $NH_4F$ | 0.4% |  |  |

TABLE 3-continued

|  | Example 3 Cleaning solution 1 | Comparative Example 3 Cleaning solution 5 | Comparative Example 4 Cleaning solution 6 |
|---|---|---|---|
| Amount of deposited Fe ($\times 10^{10}$ atoms/cm$^2$) | 6 | 86 | 460 |
| Amount of deposited Al ($\times 10^{10}$ atoms/cm$^2$) | 9 | 320 | 330 |

*1: A nonionic surface active agent represented by the formula (1) in which l is 11, m is 2, n is 8, and X is a hydrogen atom.

As can be seen from Table 3, the cleaning solution of Example 1 exhibited satisfactory metal removability while the cleaning solution of Comparative Example 4 containing no chelating agent and no chelating accelerator and that of Comparative Example 3 containing no chelating accelerator had no sufficient metal removability.

Examples 4 and 5 and Comparative Examples 5 and 6

Cleaning solutions 6-9 containing various surface active agents dissolved therein were prepared following the formulations shown in Table 4. Contact angles of the cleaning solutions with low dielectric constant film were measured. The results are also shown in Table 4. Furthermore, the solubility of the surface active agents was evaluated by visual inspection of turbidity of the solutions. A PAE film was used as the low dielectric constant film, and the concentration of the surface active agent in the cleaning solutions was 0.1%.

TABLE 4

|  | Example 4 Cleaning solution 1 | Example 5 Cleaning solution 2 | Comparative Example 5 Cleaning solution 7 | Comparative Example 6 Cleaning solution 8 |
|---|---|---|---|---|
| Surface active Agent | Polyoxyethylene lauryl ether*1 | Polyoxyethylene polyoxypropylene-lauryl ether*4 | N-520*5 | EH-6*6 |
|  | 0.1% | 0.1% | 0.1% | 0.1% |
| Ammonium oxalate | 0.1% | 0.1% | 0.1% | 0.1% |
| Hydroxyethane-diphosphonic acid | 0.01% | 0.01% | 0.01% | 0.01% |
| $NH_4OH$ | 0.05% | 0.05% | 0.05% | 0.05% |
| $NH_4F$ | 0.4% | 0.4% | 0.4% | 0.4% |
| pH | 8.5 | 8.5 | 8.5 | 8.5 |
| Contact angle | 28 | 30 | 67 | 51 |
| Turbidity | No | No | No | Cloudy |

*1: A nonionic surface active agent represented by the formula (1) in which l is 11, m is 2, n is 8, and X is a hydrogen atom.
*4: A nonionic surface active agent represented by the formula (2) in which a is 11, b is 2, d is 10, y is 1, and X is a hydrogen atom.
*5: Polyoxyethylenenonylphenyl ether manufactured by AOKI OIL INDUSTRIAL CO., LTD., a surface active agent corresponding to a formula (1) in which the oleophilic group of $CH_3$—$(CH_2)_l$ is nonylphenyl group, m is 2, n is 20, and X is a hydrogen atom.
*6: Polyoxyethylene 2-ethylhexyl ether manufactured by AOKI OIL INDUSTRIAL CO., LTD., a surface active agent corresponding to a formula (1) in which the oleophilic group of $CH_3$—$(CH_2)_l$ is 2-ethylhexyl group, m is 2, n is 6, and X is a hydrogen atom.

As shown in Table 4, the surface active agents having the formulas (1) and (2) exhibited good wettability with an insulating film of low dielectric constant. On the other hand, when the surface active agents similar to the surface active agent of the formula (1), but differing in the structure of the oleophilic group from the surface active agent of the formula (1) were used, the contact angle with the low dielectric constant film was great, and wettability was inferior, and, furthermore, the surface active agents did not dissolve in the cleaning solution and made the solution cloudy.

According to the present invention, there can be provided a cleaning solution excellent in removability for particulate foreign substances and ionic foreign substances on the semiconductor substrate after subjected to CMP process.

What is claimed is:

1. An active component for a cleaning solution for semiconductor substrates consisting of a nonionic surface active agent represented by the following formula (1), a chelating agent, a chelating accelerator, and at least one additive selected from the group consisting of a corrosion inhibitor for metal, an anionic surface active agent, cationic surface active agent, nonionic surface active agent, dispersing agent and anti-foaming agent, wherein formula (1) is:

$$CH_3-(CH_2)_l-O-(C_mH_{2m}O)_n-X \quad (1)$$

wherein l, m and n independently represent a positive number, and X represents a hydrogen atom or a hydrocarbon group, and wherein a starting material of the oleophilic group portion, $CH_3—(CH_2)_l—$, is a primary alcohol and l is 9-11.

2. The active component for a cleaning solution according to claim 1, wherein m is 2 and n is 5-10.

3. An active component for a cleaning solution for semiconductor substrates consisting of a nonionic surface active agent represented by the following formula (1), a nonionic surface active agent represented by the following formula (2), a chelating agent, a chelating accelerator, and at least one additive selected from the group consisting of a corrosion inhibitor for metal, an anionic surface active agent, cationic surface active agent, nonionic surface active agent, dispersing agent and anti-foaming agent, wherein formula (1) is:

$$CH_3—(CH_2)_l—O—(C_mH_{2m}O)_n—X \quad (1)$$

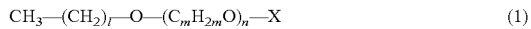

wherein l, m and n independently represent a positive number, and X represents a hydrogen atom or a hydrocarbon group, and wherein a starting material of the oleophilic group portion, $CH_3—(CH_2)_l—$, is a primary alcohol and l is 9-11, and wherein formula (2) is:

$$CH_3—(CH_2)_a—O—(C_bH_{2b}O)_d—(C_xH_{2x}O)_y—X \quad (2)$$

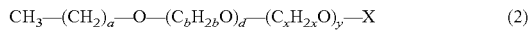

wherein a, b, d, x and y independently represent a positive number, b and x are different, and X represents a hydrogen atom or a hydrocarbon group, and wherein the starting material of the oleophilic group portion, $CH_3—(CH_2)_a—$, is a primary alcohol and a is 9-11.

4. The active component, for a cleaning solution according to claim 3, wherein b is 2, x is 3-5, d is 10 or less and y is 5 or less.

5. An active component for a cleaning solution for semiconductor substrates consisting of a nonionic surface active agent represented by the formula (2), a chelating agent, a chelating accelerator, and at least one additive selected from the group consisting of a corrosion inhibitor for metal, an anionic surface active agent, cationic surface active agent, nonionic surface active agent, dispersing agent and anti-foaming agent, wherein formula (2) is:

$$CH_3—(CH_2)_a—O—(C_bH_{2b}O)_d—(C_xH_{2x}O)_y—X \quad (2)$$

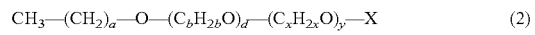

wherein a, b, d, x and y independently represent a positive number, b and x are different, and X represents a hydrogen atom or a hydrocarbon group, and wherein the starting material of the oleophilic group portion, $CH_3—(CH_2)_a—$, is a primary alcohol and a is 9-11.

6. The active component for a cleaning solution according to claim 5, wherein b is 2, x is 3-5, d is 10 or less and y is 5 or less.

7. The active component for a cleaning solution according to claims 1, 3 or 5, wherein the chelating agent is at least one compound selected from the group consisting of ethylenediaminetetraacetic acid, oxalic acid, ammonium oxalate, 1-hydroxyethylidenediphosphonic acid, citric acid, ammonium citrate, catechol, ethylenediaminediorthohydroxyphenylacetic acid [EDDHA], 8-quinolinol, and tropolone.

8. The active component for a cleaning solution according to claims 1, 3 or 5, wherein the chelating accelerator contains a hydroxide and a fluoride or a salt thereof and the hydroxide is at least one compound selected from the group consisting of ammonium hydroxide, tetramethylammonium hydroxide and choline.

9. The active component for a cleaning solution according to claims 1, 3 or 5, wherein the chelating accelerator contains a hydroxide and a fluoride or a salt thereof and and the fluoride or salt thereof is hydrofluoric acid or ammonium fluoride.

* * * * *